United States Patent [19]

LaRue et al.

[11] Patent Number: 5,027,007
[45] Date of Patent: Jun. 25, 1991

[54] FFL/QFL FET LOGIC CIRCUITS

[75] Inventors: George S. LaRue, Redmond; Timothy J. Williams, Bellevue, both of Wash.

[73] Assignee: The Boeing Company, Seattle, Wash.

[21] Appl. No.: 336,709

[22] Filed: Apr. 12, 1989

[51] Int. Cl.$^5$ ............... H03K 19/003; H03K 19/017; H03K 19/094; H03K 17/04
[52] U.S. Cl. .................................. 307/443; 307/448; 307/475; 307/542; 307/544; 307/450
[58] Field of Search ............... 307/448, 450, 475, 542, 307/544, 443, 471, 542

[56] References Cited

U.S. PATENT DOCUMENTS

| | | | |
|---|---|---|---|
| 4,716,311 | 12/1987 | Davenport et al. | 307/448 |
| 4,724,342 | 2/1988 | Sato et al. | 307/448 X |
| 4,743,782 | 5/1988 | Nelson et al. | 307/448 X |
| 4,755,695 | 7/1988 | Suzuki | 307/448 |
| 4,798,978 | 1/1989 | Lee et al. | 307/448 X |
| 4,870,305 | 9/1989 | Rocchi | 307/448 X |
| 4,877,976 | 10/1989 | Lach et al. | 307/450 |
| 4,885,480 | 12/1989 | Faris et al. | 307/448 |
| 4,896,057 | 1/1990 | Yang et al. | 307/448 |

OTHER PUBLICATIONS

Tomasetta, L. R., Processing Advances Push GaAs ICs to Higher VLSI Levels, *EDN*, Jun. 9, 1988 (pp. 243–248).

Primary Examiner—Stanley D. Miller
Assistant Examiner—David R. Bertelson
Attorney, Agent, or Firm—Christensen, O'Connor, Johnson & Kindness

[57] ABSTRACT

An FFL/QFL family of logic gates is disclosed, preferably implemented with GaAs MESFET devices and providing enhanced speed-power characteristics. Although a number of gate configurations are disclosed, a NOR gate 26 constructed in accordance with this invention includes a pair of normally OFF input transistors Q1 and Q7, which receive inputs A and B. Current sources Q2 and Q3 couple the transistors to the supply voltage $V_{DD}$ and ground, respectively. A control transistor Q6 is also coupled to the input and source transistors. An output section 30 responds to the combined operation of transistors Q1, Q2, Q3, Q6, and Q7 to produce an output C in accordance with conventional NOR logic. More particularly, upon application of a high logic input A or B to transistors Q1 and/or Q7, transistors Q1 and/or Q7 and Q6 turn ON and the output C is at a logic low level. If both inputs A and B are low, however, transistors Q1, Q6, and Q7 remain OFF, and the output C is at a high logic level. Use of the control transistor Q6 allows smaller input transistors Q1 and Q7 and current source Q3 to be used, increasing the integration level and gate speed via decreased capacitance.

47 Claims, 9 Drawing Sheets

FFL/QFL FET LOGIC CIRCUITS

FIELD OF THE INVENTION

This invention relates to families of logic gates and, more particularly, to families of logic gates employing enhancement-mode and depletion-mode transistors.

BACKGROUND OF THE INVENTION

Much of modern electronics is based upon the processing of digital signals containing information about one or more parameters of interest. A digital signal is typically a voltage that may be at any one of a plurality of discrete levels at a given point in time. The number of different levels employed is referred to as the "radix" of the system and the information contained in the signal is a function of both the system's radix and the discrete levels assumed by the voltage.

Digital systems having a variety of different radices have been developed. The most common radix for digital signals, however, is the binary radix, in which the voltage properly assumes one of two levels or states. These levels are conventionally termed "high" or "low", "true" or "false", or "1" or "0".

One of the fundamental elements of systems for processing binary digital signals is the logic gate. A logic gate typically converts one or more binary inputs into a binary output, whose level is a function both of the input levels and the particular "logic" operation performed by the gate. By employing the proper logic operation, the gate can produce a desired true/false response to the presence of binary inputs having substantially any combination of voltage levels.

A simple example of a situation in which such a logic operation might usefully be performed is provided by a manufacturing process involving the application of heat to a workpiece. Assume that a plurality of temperature sensors are employed to monitor the temperature of the workpiece at different points. Each sensor produces a high output when the temperature of the workpiece at the point monitored reaches some threshold. The sensor outputs are then transmitted to a central station for further processing by a logic gate.

To prevent the workpiece from being overheated, a logic gate that produces a high output in response to the production of a high output by any one of the sensors is employed. This high gate output then triggers an alarm, indicating that the temperature threshold has been exceeded at some point on the workpiece and allowing the operator to take corrective action. Alternatively, if the workpiece is to be uniformly heated, a different logic gate may be employed at the central station. This logic gate produces a high output only when the output of each sensor is high, indicating that the threshold temperature has been exceeded at each monitored point of the workpiece. The logic gate output then lights a display indicative of uniform workpiece heating.

To better understand the manner in which logic operations can be employed in this or other applications, a brief review of the more common operations is provided. In accordance with classic notions of Boolean algebra, there are three fundamental logic operations. These operations are commonly designated NOT, AND, and OR and can be combined to produce substantially any other logic operation.

FIG. 1A illustrates both the circuit symbol for the NOT operation, or gate, and the corresponding truth table, which indicates the output levels produced by the NOT operation for a given set of inputs. Briefly, the NOT gate, or inverter, receives a digital input A and produces an output C that is the logical inversion of the input. As a result, when the input A is low (a logic 0), the output C is high (a logic 1) and when the input A is a logic 1, the output C is a logic 0, as shown in the truth table of FIG. 1A.

FIG. 1B illustrates both the circuit symbol for the AND operation, or gate, as well as the corresponding truth table. As shown, two inputs A and B are applied to the gate, which produces an output C that is only a logic 1 when both inputs A and B are at logic 1. When either one or both logic inputs A and B are at logic 0, the output C is also a logic 0.

In FIG. 1C, the circuit symbol for the OR operation, or gate, is illustrated, along with the corresponding truth table. As shown, inputs A and B are combined to produce an output C that is a logic 1 if either or both inputs A and B are also at a logic 1. Thus, output C is only a logic 0 in the event that both inputs A and B are at logic 0.

From these fundamental logic operations, other logic operations can be produced. For example, a NAND operation can be performed by combining the AND and NOT operations described above. The circuit symbol and truth table for the NAND operation are depicted in FIG. 1D. As shown, the output C of the NAND gate is a logic 1 for all input conditions other than both inputs A and B being at logic 1.

The OR and NOT operations can also be combined to produce a NOR logic operation whose circuit symbol and truth table are shown in FIG. 1E. As shown, the output C of the NOR gate is a logic 1 only when both inputs A and B are at logic 0. Otherwise, output C of the NOR gate is at a logic 0.

Finally, in FIG. 1F, the circuit symbol and truth table for an exclusive-OR operation are shown. The output C of the exclusive OR gate is a logic 1 only when one or the other, but not both, of the inputs A and B are at a logic 1. Thus, as shown, when both inputs A and B are either a logic 0 or a logic 1, the exclusive-OR output C is at a logic 0.

As suggested previously, the various logic operations illustrated in FIG. 1 can be combined in accordance with a number of rules, laws, and theorems from Boolean algebra to perform other, more complex operations. In addition, many logic operations can be broken down into simpler operations by such algebra. Further, although the various operations or gates illustrated in FIGS. 1B through 1F are shown as having two inputs, additional inputs can be employed. For example, the AND gate of FIG. 1B could respond to four input gates, producing a logic 1 at output C only when all four inputs are at a logic 1.

Discussing now the manner in which such logic operations have traditionally been performed, a number of implementations have been adopted. For example, electromechanical arrangements have been developed employing electromagnetic relays that respond to high and low voltage levels to open and close switch contacts that further control the establishment of other voltages. Similarly, arrangements employing pneumatically controlled switch elements have been developed.

Most modern digital systems and computers, however, employ electronic circuits to perform logic functions. These circuits are typically constructed from a plurality of semiconductor devices, which can be densely packed in a relatively small space by use of integrated circuit techniques. The devices included in such semiconductor logic circuits are formed from semiconducting materials such as silicon (Si), germanium (Ge), selenium (Se), gallium arsenide (GaAs), or cadmium sulfide (CdS). Although silicon is currently the most prevalently used semiconducting material, the enhanced speed characteristics of GaAs is leading to its increased usage.

The electrical properties of these semiconducting materials may be varied by intentionally "doping," or adding impurities to them. In that regard, a donor dopant introduces additional negative charge carriers or electrons (n) into the material, while an acceptor dopant introduces additional positive charge carriers or holes (p) into the material. In the case of GaAs semiconducting materials, the donor dopant is typically silicon (Si) and the acceptor dopant is typically zinc (Zn).

The most common element of logic circuits formed from such semiconducting materials is the transistor. Transistors can be either of bipolar or unipolar design, with the unipolar arrangement being of primary interest in this context. Unipolar transistors, commonly known as field-effect transistors (FETs), can be further classified as junction field-effect transistors (JFETs) or insulated-gate field-effect transistors (IGFETs).

Addressing the IGFET construction in greater detail, as shown in FIG. 2, an IGFET includes a substrate with drain and source regions D and S formed therein. The drain and source are both doped with charge carriers of the same polarity (for example, n), while the substrate is doped with charge carriers of the opposite polarity (for example, p). A gate region G is provided over the substrate between the source and drain but is separated therefrom by an insulator or semiconductor. Although the most common construction of IGFETs is the metal-silicon dioxide-silicon, field-effect transistor (MOSFET), an arrangement frequently used with GaAs semiconductors is the metal-semiconductor, field-effect transistor (MESFET). The MESFET includes a thin film of GaAs deposited onto the transistor substrate over the channel, with a layer of metal directly deposited onto the surface of the GaAs film.

In a depletion mode of operation, the IGFET includes a channel region of material, extending between the source and drain, that is doped with charge carriers of the same polarity as the source and drain. This channel provides a current path through the IGFET. Specifically, assuming the use of acceptor dopant in the channel, with the source and substrate electrically connected and a low logic level voltage applied between the gate and source, current easily flows through the channel. Thus, the IGFET is said to be "normally ON". When a high logic level voltage is applied between the gate and source and/or the drain and source, however, the gate and drain voltages may repel charge carriers from the channel, increasing the resistance of the channel to the flow of current. In this condition, the IGFET is said to be "OFF".

In an enhancement mode of operation, the IGFET does not normally include a doped channel. Thus, the enhancement-mode IGFET is said to be normally "OFF". A channel can be formed, however, by the repulsion of charge from the substrate between the source and drain. For acceptor-doped drain and source regions, this repulsion is accomplished by applying a high logic level voltage between the gate and source. This voltage ultimately results in the formation of a region, having charge carriers similar to the source and drain, through which current can flow. In this condition, the IGFET is said to be "ON".

As will be appreciated, IGFETs can be constructed to employ either n- or p-type materials for their channels. Basically, the operation of n-channel depletion-mode and enhancement-mode transistors is the same as the p-channel operation described above. Because the polarity of the charge carriers in the channel is reversed, however, the signs of the voltages and currents defining IGFET operation are reversed.

Having reviewed the basic logic operations to be performed, as well as the structure of an IGFET component of a circuit for performing them, the manner in which such IGFET building blocks are combined to perform logic operations is now discussed. Traditionally, the semiconductor circuits that implement logic operations are known as "gates" and are grouped according to their "family". These family groupings are a function of characteristics common to each gate in the family, such as the type of elements included, in the case of transistor-transistor logic (TTL), or the manner in which the elements are connected, in the case of emitter-coupled logic (ECL).

Many of the operational characteristics of a family are important to a digital circuit designer in deciding which families to employ in a particular application. For example, the speed at which the gates of a family can perform logic operations is important in many applications. As used in this context, speed collectively refers to propagation time and rise and fall time. The propagation time of a logic gate is the interval of time required for a change in the logic level at an input of the gate to produce a change in the logic level at the gate's output. The rise and fall times of the gate correspond to the times required for the output of the gate to change from a low level to a high level and from a high level to a low level, respectively.

Another important characteristic of a logic family is the amount of power dissipated in its elements. Power dissipation affects the size of power supply required to operate the gates and leads to the undesirable heating of components. Higher component temperatures may, in turn, affect gate performance or limit the integration level of the devices. Power consumption for gates in most families is on the order of milliwatts and, for the reasons outlined above, is preferably as low as possible.

The manner in which a logic gate interfaces with other gates or elements is also important to the circuit designer. As discussed, the logic gate produces an output that is a function of several inputs. The number of inputs that can be applied to the gate is referred to as its fan-in. Similarly, the fan-out of the gate is an indication of the number of unit logic gates that the gate can drive.

Another important characteristic of the logic gate is its noise immunity. This term refers to the gate's ability to avoid erroneous operation that might otherwise occur if, for example, the high-frequency noise produced by high-speed circuits caused the gate to misinterpret an input logic level. One measure of the noise immunity of a gate is its noise margin. Noise margin is basically the difference in the definition of logic levels at the input and output terminals of the gate.

As a simple illustrative example of noise margin, assume that the logic gate interprets any inputs below one volt to be a logic 0 and any inputs above four volts to be a logic 1. In contrast, the gate produces a logic 0 output that is always less than one-half volt and a logic 1 that is always greater than four and one-half volts. Provided that less than one-half volt of noise is introduced between the output of a first logic gate and the input of a subsequent gate, a logic 0 will still be recognized as a logic 0 and a logic 1 will still be recognized as a logic 1. Thus, erroneous operation will not occur. A gate constructed in this manner has a noise immunity of one-half volt.

Although perhaps somewhat less important than the factors noted above, there are a number of additional characteristics of a family of logic gates that may be of interest. For example, the temperature stability and process spread of the gate are generally important. Similarly, the complexity, or number of devices required to produce a gate, can be significant to the circuit designer. Further, factors including circuit reliability, the number of devices that can be integrated into a given area of a semiconductor substrate, and the yield, or percentage of integrated devices that are ultimately usable, can be important.

A number of different logic family designs have been developed to improve these various GaAs logic family characteristics. One such design is the direct-coupled FET logic (DCFL) family shown in FIG. 3A. The NOR gate illustrated includes two enhancement-mode transistors T1 and T2 and one depletion-mode transistor T3. The source terminals of transistors T1 and T2 are coupled to ground. Inputs A and B are applied to the gate terminals of transistors T1 and T2, respectively. The drain terminals of transistors T1 and T2 are coupled to the gate and source terminals of transistor T3, all of which define an output C. The drain terminal of transistor T3 is coupled to the supply voltage $V_{DD}$.

In operation, the depletion-mode transistor T3 is always ON, by virtue of its interconnected gate and source terminals, and operates as a current source. The enhancement-mode input transistors T1 and T2 are normally OFF, preventing the flow of current from source transistor T3 to ground. Because source transistor T3 itself provides little resistance to the flow of current, the output C rises or is "pulled" to a high logic level (roughly $V_{DD}$). Output C remains at this logic level until one or both of the inputs A and/or B are at a high logic level, causing the input transistors T1 and/or T2 to turn ON. At that point, there is little resistance between the output C and ground, and output C is pulled to a low logic level near ground. As will be appreciated from FIG. 1E, such operation is in accordance with standard NOR logic.

The DCFL family has "medium" speed characteristics, achieving roughly a 1500 megahertz flip-flop toggle rate. In addition, gates in the family exhibit low power consumption on the order to 0.2 to 0.4 milliwatt per gate. The family also has relatively poor noise margin characteristics and offers limited complexity.

As shown in FIG. 3B, a gate from a buffered MESFET logic (BFL) family adds to the basic DCFL configuration a buffered output section. This output section includes an enhancement-mode transistor T4, a depletion-mode transistor T5, and a diode D1. While the basic operation of this NOR gate is the same as that of the NOR gate illustrated in FIG. 3A, the pull-up transistor T4 loads the gate and its size influences both the power dissipation and speed of the gate. The diode D1 adds a voltage drop between the source $V_{DD}$ and the output C so that the logic levels of the output C are within the thresholds of the next gate.

As will be appreciated from a comparison of FIGS. 3A and 3B, the BFL gate is more complex than DCFL gate. In addition, the BFL family consumes more power. The BFL family does, however, advantageously accommodate a higher fan-out and exhibits a good noise margin. Further, BFL gates are relatively insensitive to processing and power supply variations.

A third logic family employing depletion-mode and enhancement-mode field effect transistors in the low-power FET logic (LPFL) family. As shown in FIG. 3C, an LPFL NOR gate adds to the BFL NOR gate of FIG. 3B, another depletion-mode transistor T6, coupled between the source terminals of transistors T1 and T2 and ground. This additional transistor T6, like transistor T3, operates as a current source. The basic operation of the LPFL NOR gate is the same as the BFL NOR gate. While the power requirements of the LPFL family are significantly less than those of the BFL family, LPFL may be slower than BFL.

As will be appreciated from the preceding remarks, it would be desirable to produce a logic family employing enhancement- and depletion-mode FETs and having, for example, improved speed, power consumption, noise margin, and fan-in and fan-out characteristics.

SUMMARY OF THE INVENTION

In accordance with the present invention, an FET-FET and quasi-FET-FET logic (FFL/QFL) family is disclosed. Although there are tradeoffs among speed, power, and noise margin characteristics of any family, the FFL/QFL has an improved speed-power combination, without sacrificing noise margin or the ability to produce complex logic functions.

In accordance with one embodiment of the invention, a member of the FFL/QFL family of logic gates is disclosed. Each of the gates is for performing a logic operation on one two-state input to produce a two-state output. The member includes a first input field-effect transistor, which is operable in an enhancement mode and includes gate, drain, and source terminals. The gate terminal is for receiving the two-state input.

A member of the family also includes a control field-effect transistor, which is operable in an enhancement mode and has gate, drain, and source terminals. The gate terminal of the control transistor is coupled to the source terminal of the first input transistor, while the drain terminal of the control transistor is coupled to the drain terminal of the first input transistor. The first input transistor and control transistor cooperatively perform the logic operation to produce the two-state output at the drain terminal of the control transistor.

In accordance with a further embodiment of the invention, a second two-state input is to be processed and the member further includes a second input field-effect transistor. The second transistor is operable in an enhancement mode and includes gate, drain, and source terminals. The gate terminal of the second input transistor is for receiving the second two-state input. The drain terminal of the second input transistor is coupled to the drain terminal of the first input transistor and the source terminal of the second input transistor is coupled to the source terminal of the first input transistor. The first and second input transistors and the control transistor cooperatively perform the logic operation to produce the two-state output at the drain terminal of the control transistor. Alternatively, the source terminal of the second input transistor may be coupled to the drain terminal of the first input transistor, while the drain terminal of the second input transistor is coupled to the drain terminal of the control transistor.

In accordance with further aspects of the invention, a buffered output section can be coupled to the first input transistor and the control transistor. Similarly, various input sections can be coupled to the first input transistor and control transistor to change the logic operation performed. In addition, the various transistors may be GaAs MESFETs. Further, NOT, OR, AND, NOR, NAND, and XOR functions may be performed.

BRIEF DESCRIPTION OF THE DRAWINGS

The invention will presently be described in greater detail, by way of example, with reference to the accompanying drawings, wherein.

DETAILED DESCRIPTION OF THE PREFERRED EMBODIMENT

Figure 4:
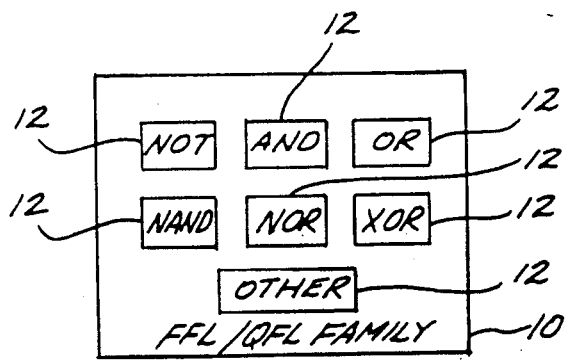
FIG. 4 schematically illustrates an FFL/QFL family including gates for performing the various operations of FIGS. 1A through 1F.
Figure 5:
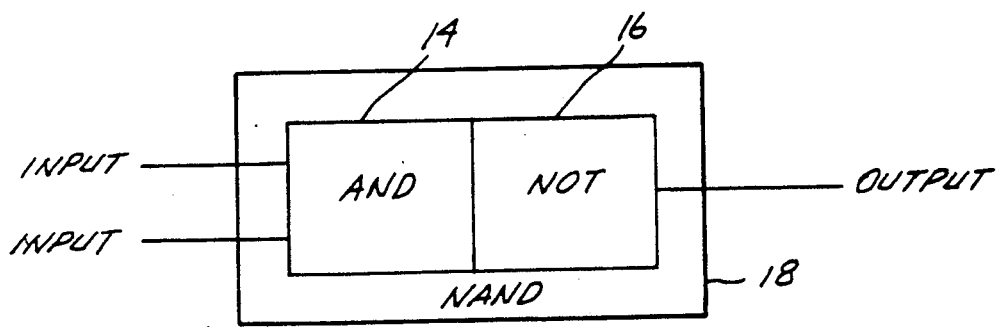
FIG. 5 schematically illustrates the manner in which various ones of the gates of FIG. 4 can be combined to perform more complex operations.

Referring now to FIG. 4, a new logic family 10 is disclosed, which may be referred to as an FET-FET and quasi-FET-FET logic (FFL/QFL) family. Like other logic families, the FFL/QFL family 10 includes various gates 12 for performing the fundamental NOT, AND, and OR logic operations, as well as more complex logic operations such as NOR, NAND, and XOR. By combining gates in accordance with standard notions of Boolean algebra, other gates 12 can be produced to perform substantially any logic operation. A simple example is shown in FIG. 5, where an AND gate 14 is connected in series with a NOT gate 16 to produce a NAND gate 18.

In a preferred embodiment, the FFL/QFL family is implemented with GaAs semiconducting devices. Although other devices, such as silicon, could be employed, the combined speed and power characteristics of this family are particularly advantageous in a GaAs implementation. The preferred embodiments of the FFL/QFL logic family are implemented with enhancement-mode and depletion-mode MESFET transistors, although other enhancement-mode and depletion-mode designs such as SDHT (i.e., HEMT, TEGFET, MODFET, HFET) and pseudomorphic FETS can be employed. Regardless of its implementation, the FFL/QFL family 10 is designed to improve the combined speed and power characteristics of prior art arrangements, without unduly limiting the family's noise margin or ability to perform complex logic operations with a relatively few components.

Figure 6:
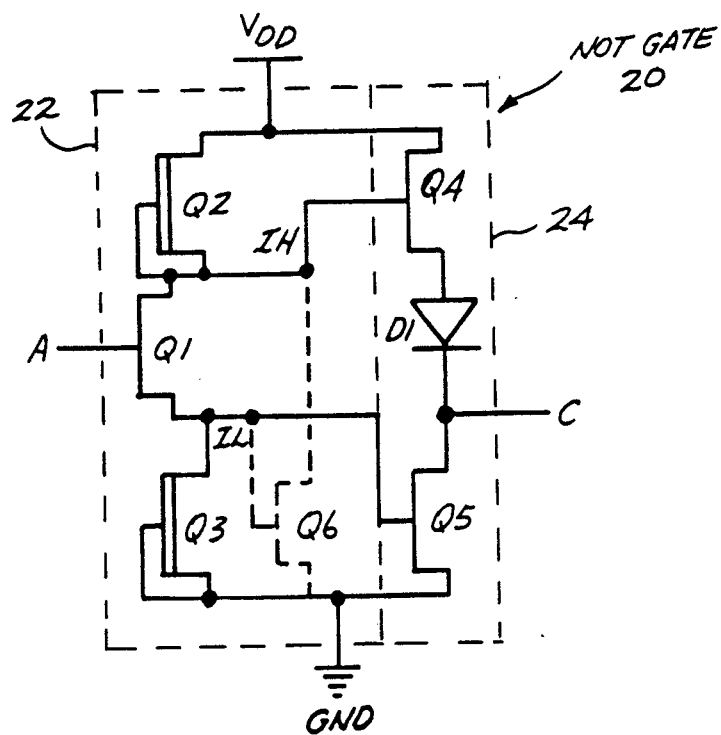
FIG. 6 schematically illustrates a NOT logic gate constructed in accordance with this invention.

Reviewing now a number of the preferred FFL/QFL family gate constructions, reference is initially had to FIG. 6. The NOT, or inverter, gate 20 shown receives an input A and produces an output C. The logic level of output C is a function of the logic level of input A, as indicated by the truth table of FIG. 1A.

Reviewing the construction of NOT gate 20, it includes five transistors and one diode. For convenience, the continuing references to transistors in the ensuing description of the preferred embodiments of the FFL/QFL family are to n-channel MESFET implementations with GaAs semiconductors. Similarly, the same reference letters and numbers are employed to identify like components of the various gates described.

As shown in FIG. 6, the input A of NOT gate 20 is applied to the gate terminal of a first enhancement-mode input transistor Q1. The drain terminal of input transistor Q1 is connected to both the gate and source terminals of a depletion-mode source transistor Q2. The source terminal of transistor Q1 is connected to the drain terminal of another depletion-mode source transistor Q3. The drain terminal of source transistor Q2 is coupled to the voltage supply $V_{DD}$, while the gate and source terminals of source transistor Q3 are coupled to ground. Transistors Q1, Q2, and Q3 cooperatively define an input stage 22 of NOT gate 20, with transistor Q1 operating as the input and transistors Q2 and Q3 operating as current sources.

A buffered output stage 24 of NOT gate 20 includes enhancement-mode transistors Q4 and Q5 and a diode D1. As shown in FIG. 6, the gate terminal of output transistor Q4 is connected to the drain terminal of input transistor Q1 and the gate and source terminals of source transistor Q2. The drain terminal of output transistor Q4 is connected to the supply voltage $V_{DD}$, while the source terminal of output transistor Q4 is connected to the positive side of diode D1. The gate terminal of the other output transistor Q5 is connected to the source terminal of input transistor Q1 and the drain terminal of source transistor Q3. Finally, the drain terminal of output transistor Q5 is connected to the negative side of diode D1, while the source terminal of output transistor Q5 is connected to ground.

Reviewing the operation of NOT gate 20, as noted previously, depletion-mode FETs operate in a manner similar to "normally ON" switches, while enhancement-mode FETs operate in a "normally OFF" manner. Thus, with input A at a low or logic 0 level, the input transistor Q1 is in its normal, OFF, condition.

With its gate and source terminals connected, transistor Q2 is always ON and operates as a current source. As a result, source transistor Q2 pulls the drain terminal of input transistor Q1 and the gate terminal of output transistor Q4, commonly designated node IH in FIG. 6, up to a high logic level roughly equal to $V_{DD}$. With node IH at a high logic level, the output transistor Q4 turns ON, pulling the output C of gate 20 to a voltage that roughly equals $V_{DD}$, minus the voltage drop across diode D1.

Similarly, with the gate and source terminals of source transistor Q3 connected, transistor Q3 is always ON. Thus, transistor Q3 pulls the connection between the source terminal of input transistor Q1, the drain terminal of source transistor Q3, and the gate terminal of output transistor Q5, designated node IL in FIG. 6, to a low logic level near ground. As a result, transistor Q5 is maintained in its OFF condition and the output C is at a high logic level.

When the input A changes to a high or logic 1 voltage level, input transistor Q1 turns ON. In that condition, transistors Q1 and Q2 cooperatively pull the voltage at node IL up. Thus, the gate terminal of output transistor Q5 is at a high logic level, turning transistor Q5 ON. At the same time, node IH is pulled low by the transistors Q1 and Q3, turning transistor Q4 off. With output transistor Q5 ON, the output C is pulled to a low logic level near ground. As will be appreciated from the preceding discussion, the NOT gate 20 of FIG. 6 produces a high logic output C when input A is low, and a low logic output C when the input A is high. This operation is summarized in the truth table depicted for NOT gates in FIG. 1A.

As shown with broken lines in FIG. 6, a control transistor Q6 may also be added to NOT gate 20 in a preferred embodiment. Specifically, the gate terminal of this enhancement-mode transistor Q6 is connected to node IL, while its drain and source terminals are connected to node IH and ground, respectively. Although the basic operation of NOT gate 20 remains unchanged, the inclusion of transistor Q6 improves gate speed and reduces the space required to form a gate in an integrated circuit.

More particularly, when a high logic input A is applied to the gate terminal of input transistor T1, node IL is pulled to a high logic level, as previously described. With node IL high, control transistor Q6 turns ON and cooperates with the series combination of input transistor Q1 and source transistor Q3 to pull node IH to a low logic level, turning output transistor Q4 OFF. With control transistor Q6 supplementing the operation of transistors Q1 and Q3 in this manner, smaller transistors Q1 and Q3 can be employed. As a result, the area required for NOT gate 20 is decreased, along with the MESFETs capacitance, increasing the integration level and speed, respectively, of NOT gate 20.

A second type of FFL/QFL gate to be addressed is the NOR gate. As shown, for example, in FIG. 7, one embodiment of an FFL/QFL NOR gate 26 adds another enhancement-mode transistor to the preferred NOT gate 20 of FIG. 6. Transistor Q7 is a second input transistor and includes a gate terminal for receipt of the second input B. The drain and source terminals of input transistor Q7 are connected to nodes IH and IL, respectively. The remaining elements of NOR gate 26 are the same as those illustrated for the preferred NOT gate 20 of FIG. 6.

Figure 1B:
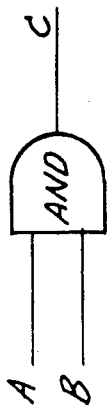
FIGS. 1A through 1F depict the circuit symbols and truth tables associated with the NOT, AND, OR, NAND, NOR, and XOR logic operations or gates, respectively.
Figure 1D:
Figure 1F:
Figure 1A:
Figure 1C:
Figure 1E:
Figure 3C:
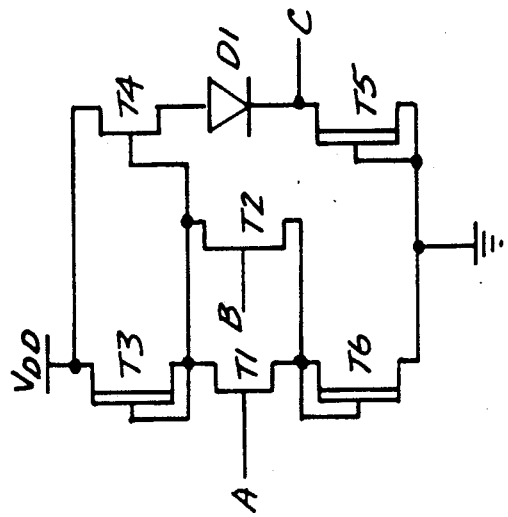
FIGS. 3A through 3C depict NOR logic gates constructed with gates from DCFL, BFL, and LPFL logic families.
Figure 3B:
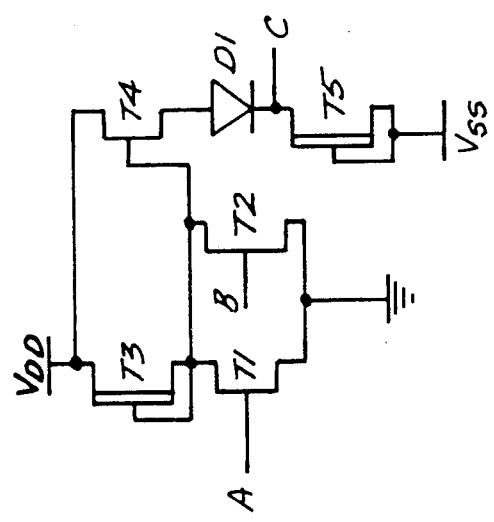
Figure 3A:
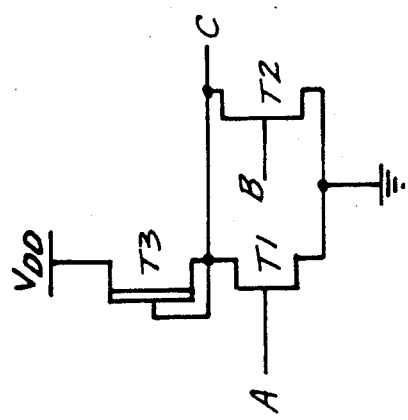
Figure 2:
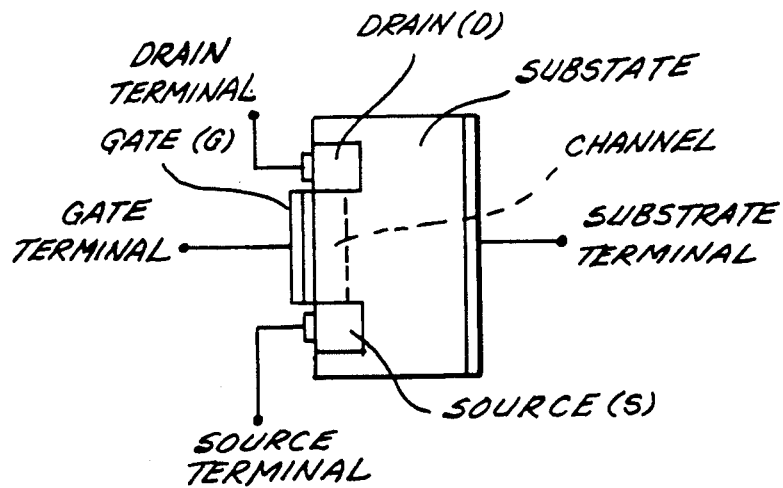
FIG. 2 schematically illustrates the construction of an IGFET, usable as a building block of a gate for performing the logic operations of FIGS. 1A through 1F.

As will be appreciated from the truth table illustrating the operation of a NOR gate, shown in FIG. 1E, the output C of NOR gate 26 should be at a high logic level only when both inputs A and B are at low logic levels. It then follows that, if either or both inputs A and B are at a high logic level, the output C should be at a low logic level.

To verify that operation, first assume that either input A, or input B, or both, is high. As will be appreciated from the preceding discussion of NOT gate 20, the normally ON transistors Q2 and Q3 always operate as current sources. Although the input transistors Q1 and Q7 are normally OFF, by applying a high logic level to the gate terminal of either input transistor Q1 or Q7, however, the transistor will turn ON. Thus, current will flow through transistor Q2 and the "ON" input transistor or transistors to pull node IL to a high logic level. With this high logic voltage applied to the gate terminals of the control transistor Q6 and output transistor Q5, transistors Q6 and Q5 turn ON. Control transistor Q6 then cooperates with the series combination of the "ON" input transistors and current source Q3 to pull node IH to a low logic level. Because the gate terminal of output transistor Q4 is connected to node IH, the output transistor Q4 then turns off. The diode D1 is included to ensure that the voltage at the source terminal of output transistor Q4 is sufficiently high so that transistor Q4 will, in fact, turn off when node IH is pulled low. With output transistor Q4 OFF and output transistor Q5 ON, the output C will be at a low logic level close to ground, as required by conventional NOR operation.

To complete the operational description of NOR gate 26, the situation in which both inputs A and B are a low logic level must be considered. With low levels applied to the gate terminals of both input transistors Q1 and Q7, these transistors remain in their normally OFF condition. As a result, current source Q2 pulls the voltage at node IH up to roughly $V_{DD}$, turning the normally OFF output transistor Q4 ON. Similarly, the current source Q3 pulls the voltage at node IL close to ground, turning transistors Q5 and Q6 OFF. Because current no longer flows through output transistor Q5, the output rises to a high or logic 1 level in accordance with standard NOR operation.

Figure 7:
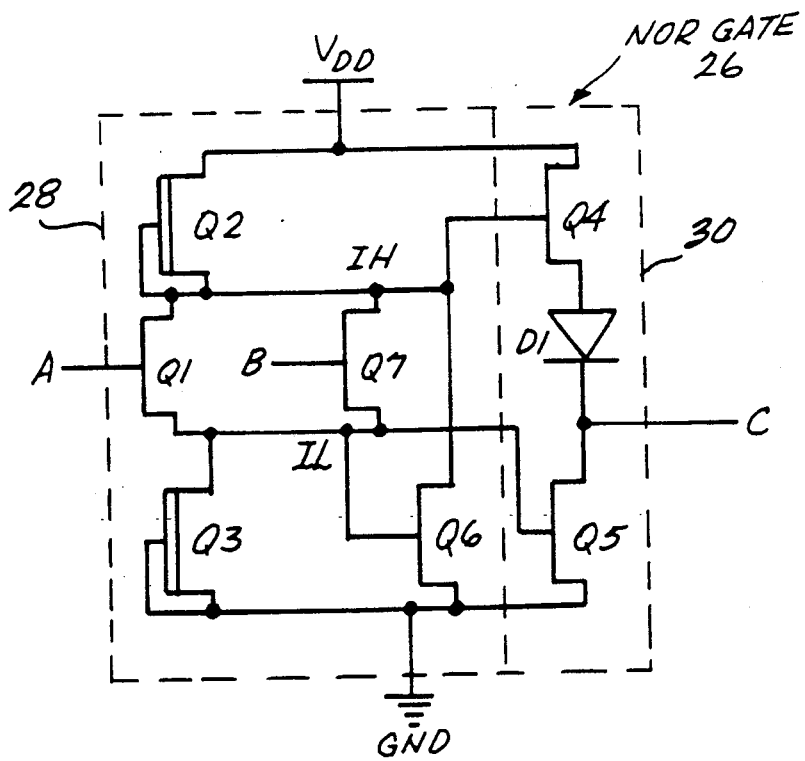
FIG. 7 schematically illustrates a NOR logic gate constructed in accordance with this invention.

As shown in FIG. 7, NOR gate 26 includes an input section 28 and an output section 30. The output section 30 draws little DC current from source $V_{DD}$ regardless of the state of output C because one or the other of the output transistors Q4 and Q5 is always OFF. This push-pull operation results in low-power operation and ensures reliable high and low logic levels. The average DC power dissipation of gate 26 is one-half the product of the supply voltage $V_{DD}$ and the current flowing through the source transistor Q2 when output C is low. The AC power dissipation is a function of both the capacitance on the interconnect lines and the operating frequency of the gate.

Reviewing the noise margin of NOR gate 26, as the supply voltage $V_{DD}$ increases, the high logic level at output C increases until the input transistor of the next logic gate that is coupled to the output C begins to conduct current through its gate terminal. In this condition, the noise margin is the highest, but the flow of current through the gate of the subsequent input transistor increases power dissipation. To avoid the additional power dissipation, the high output logic level is limited to twice the forward turn-on voltage ($V_j$) of the input transistor.

Addressing the issue of noise margin more thoroughly, it is helpful to define a threshold voltage $V_{1t}$ as the voltage at which the inputs A and B and output C of gate 26 are equal. This voltage $V_{1t}$ is approximately equal to the sum of the forward turn-on voltage $V_j$ of the input transistor and the threshold voltage $V_{te}$ of the enhancement-mode transistor, which is typically on the order of 0.2 volt.

Assuming that inputs A and B are both at a low logic level, node IL is pulled to ground by current source Q3. Until either input A or B rises above the threshold voltage $V_{te}$, the voltages at nodes IH or IL do not change. The output C, in turn, changes only slightly until one of the inputs A or B reaches approximately twice the threshold voltage $V_{te}$. At that time, transistors Q5 and Q6 both start to conduct. Operated in this manner, gate 26 has a low-level noise margin of approximately $2V_{te}$, or 0.4 volt. This relatively good noise margin allows the gate to accommodate large variations in process, temperature, and power supplies. Thus, variations in transistor parameters with temperature and location in the integrated circuit are less likely to affect gate operation. Similarly, power supply variations resulting from the finite resistance of power supply metalization at each gate will be less disruptive of the operation of the FFL/QFL gate.

Although control transistor Q6 can be omitted from NOR gate 26, as suggested previously, the input transistors Q1 and Q7 and current source Q3 need to be larger to accommodate the additional current that would otherwise be conducted by control transistor Q6. As a result, gate area increases, consuming additional space in the integrated circuit. Further, the capacitances associated with the MESFETs Q1, Q3, and Q7 increase, reducing the speed of the gate. This problem is exacerbated with high fan-in or fan-out, further increasing capacitance and gate delay. Thus, the inclusion of control transistor Q6 has a number of advantages.

Figure 8:
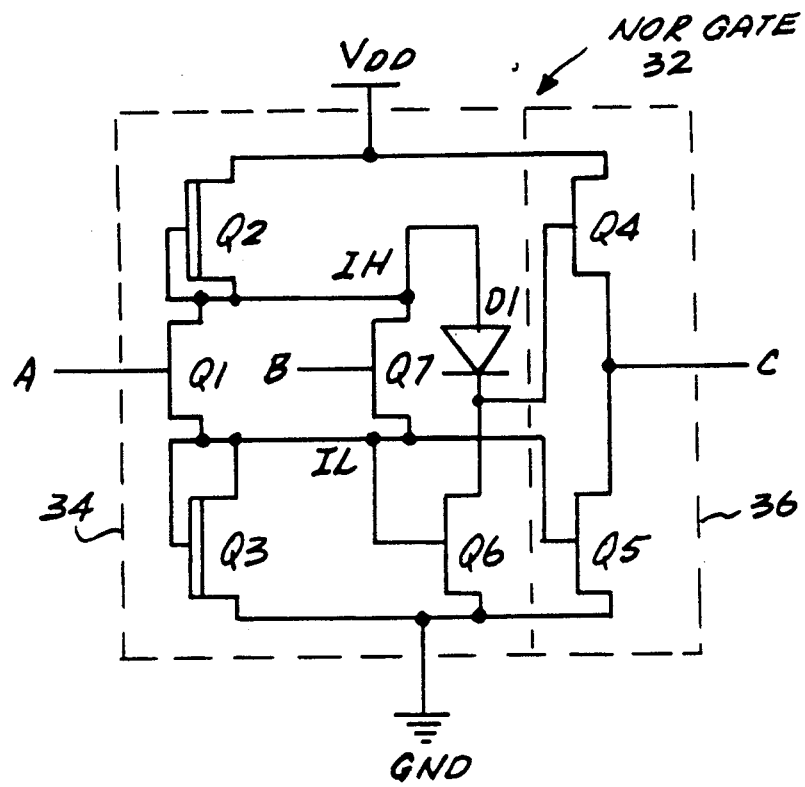
FIG. 8 schematically illustrates an alternative embodiment of the NOR logic gate of FIG. 7.

An alternative embodiment of the FFL/QFL NOR gate 26 is shown in FIG. 8 as NOR gate 32. As illustrated, NOR gate 32 is identical to NOR gate 26, except diode D1 has been moved to input section 34 from output section 36. Specifically, diode D1 connects the drain of control transistor Q6 and the gate of output transistor Q4 to node IH. Also, in the arrangement of FIG. 8, the gate terminal of current source Q3 has been connected to the source of input transistor Q1 rather than the source of transistor Q3.

NOR gate 32 advantageously employs a smaller diode D1 than NOR gate 26. As a result, the area of an integrated circuit that is consumed by the gate decreases and its speed increases. Otherwise, the operation of NOR gate 32 is the same as that described in connection with NOR gate 26.

Figure 9:
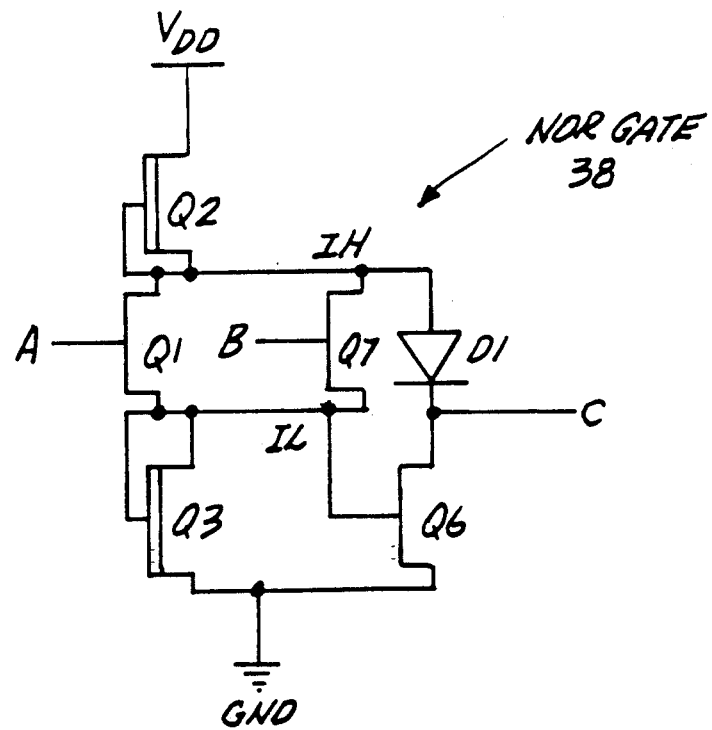
FIG. 9 schematically illustrates a second alternative embodiment of the NOR logic gate of FIG. 7.

Similarly, the NOR gate 38 depicted in FIG. 9 is identical to that shown in FIG. 8 with the exception that the output stage 36 of gate 32, including transistors Q4 and Q5, has been deleted. This unbuffered version of NOR gate 32 dissipates basically the same power as gate 32, but employs fewer devices. As a result, a higher integration level can be achieved. NOR gate 38 is also able to drive small loads faster than gate 32.

As will be appreciated, NOT gate 20 can be combined with NOR gate 26, 32, or 38 to produce an OR gate. Specifically, in such an arrangement, the output C of the NOR gate is applied to input A of the NOT gate. The output C of the NOT gate will then be the logic OR combination of the NOR gate inputs A and B.

Figure 10:
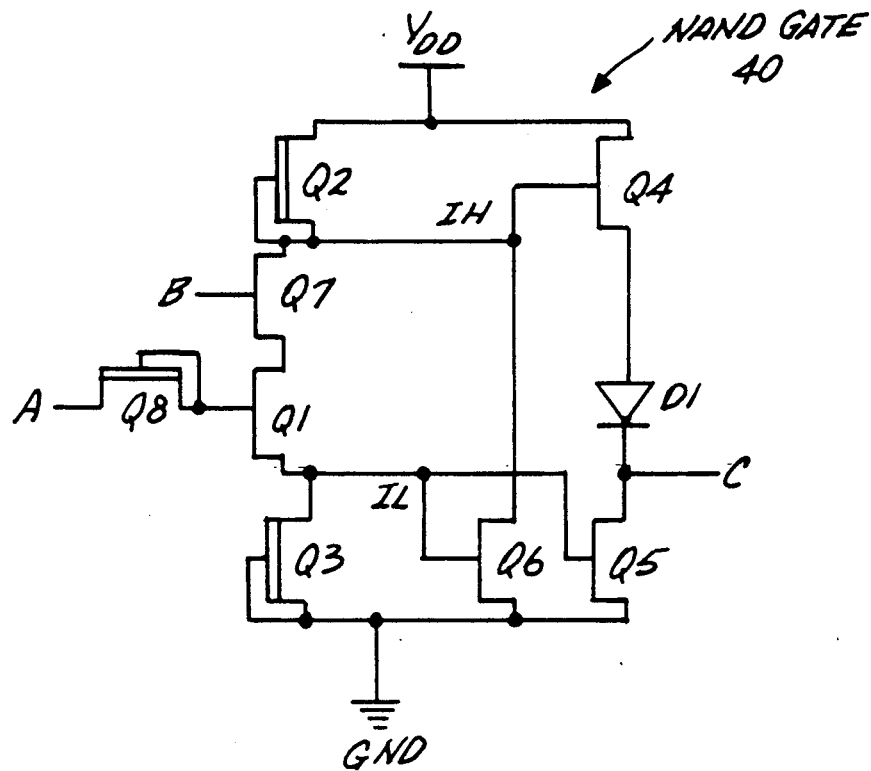
FIG. 10 schematically illustrates a NAND logic gate constructed in accordance with this invention.

Turning now to the manner in which NAND gates can be produced with the FFL/QFL family, reference is had to FIG. 10. As shown, NAND gate 40 corresponds to the NOR gate 26 shown in FIG. 7, with two significant exceptions. First, the input enhancement-mode transistor Q7 has been placed in series, rather than in parallel, with input transistor Q1. Specifically, the drain of input transistor Q1 is connected to the source of input transistor Q7, while the drain of transistor Q7 is connected to node IH.

The second difference between NAND gate 40 and NOR gate 26 is the addition of an input section or current-limiting depletion-mode transistor Q8 to the gate terminal of the input transistor Q1. As shown in FIG. 10, the gate and source terminals of transistor Q8 are coupled to the gate terminal of input transistor Q1. In this arrangement, the input A of NAND gate 40 is applied to the drain terminal of transistor Q8, while input B is applied to the gate terminal of input transistor Q7.

Discussing now the operation of NAND gate 40, as will be appreciated from the NAND truth table of FIG. 1D, the output C of NAND gate 40 is properly at a low logic level only when both inputs A and B are at high logic levels. Confirming that operation, it is first noted that the enhancement-mode input transistors Q1 and Q7 are normally OFF, while the depletion-mode transistor Q8 is always ON by virtue of the connection between its gate and source terminals. Thus, with a low logic level applied to either or both inputs A and B, one or both of the input transistors Q1 and Q7 will remain OFF. As a result, current source Q2 will pull node IH up to a high logic level near $V_{DD}$. The high voltage at node IH is applied to the gate terminal of output transistor Q4, turning transistor Q4 ON. Similarly, current source Q3 pulls node IL to a low logic level near ground and the resulting low voltage at the gate terminals of output and control transistors Q5 and Q6 maintains them in their normally OFF condition. With no current flowing through output transistor Q5, the output C will be at a high logic level, approximately equal to $V_{DD}$ minus the voltage drop across diode D1.

Only when both inputs A and B are high will the series combination of input transistors Q1 and Q7 be ON, pulling node IL to a high logic level. This high logic level is applied to the gate terminals of transistors Q5 and Q6, turning them ON. The combined operation of control transistor Q6 and the series combination of transistors Q7, Q1, and Q3 then pulls node IH to a low logic level, turning output transistor Q4 OFF. As a result, the output C is at a low logic level in accomplishment of the NAND logic operation.

If transistor Q8 were omitted from NAND gate 40, the gate leakage current from input transistor Q1 would allow the node IL to be pulled up when input A was at a high logic level and input B was low. As a result, both output transistors Q4 and Q5 would be simultaneously ON, preventing logic gate 40 from performing the NAND function. By including current-limiting transistor Q8, however, the gate leakage current can be controlled to prevent node IL from being pulled to a high logic level. A disadvantage of such current limiting, however, is that it decreases the gate's speed.

The current should be limited to provide a noise margin that ensures that the output of gate 40 remains sufficiently high when driving several lower NAND inputs. Current limiting is also a function of the number of NAND inputs applied to gate 40, given that the combined input currents must not pull the voltage at node IL to a high logic level.

Figure 11:
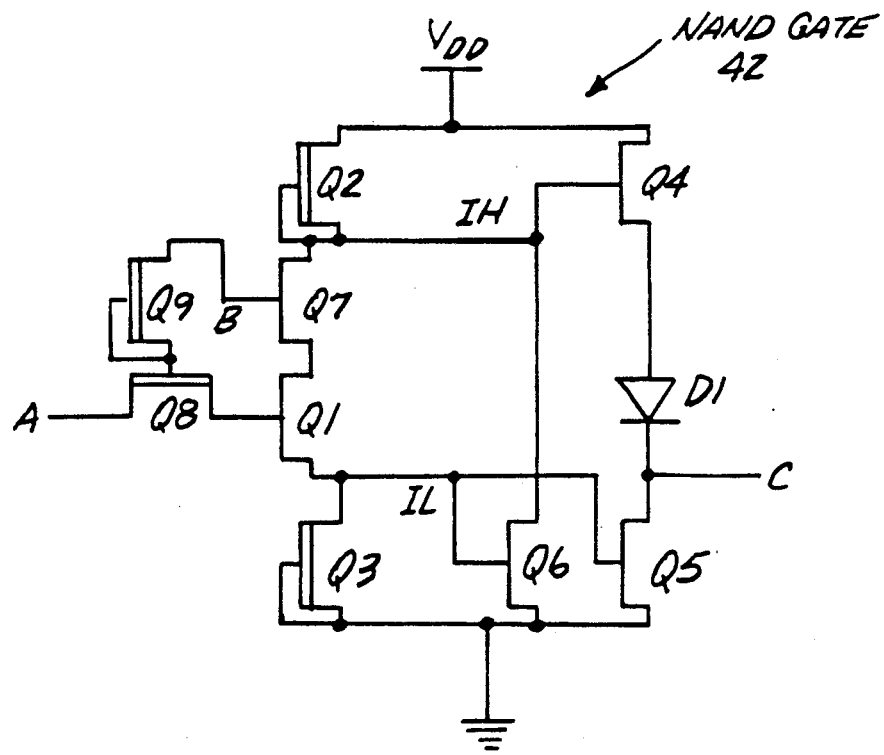
FIG. 11 schematically illustrates an alternative embodiment of the NAND gate of FIG. 10.

To improve the gate delay resulting from current limiting, an alternative NAND gate 42 is depicted in FIG. 11. As shown in FIG. 11, NAND gate 42 modifies the NAND gate 40 of FIG. 10 only slightly. More particularly, another depletion-mode transistor Q9 is added to the input section between the gate terminals of transistors Q7 and Q8. Specifically, the source terminal of transistor Q8 is connected to the gate terminal of transistor Q1; the gate and source terminals of transistor Q9 are connected to the gate terminal of transistor Q8; and the drain terminal of transistor Q9 is connected to the gate terminal of transistor Q7.

The basic operation of gate 42 is the same as that of gate 40. More particularly, with both inputs A and B at a low logic level, a low voltage is applied to the gate terminal of input transistor Q7, maintaining transistor Q7 in its normally OFF condition. In addition, the low level input B is applied, via the always ON transistor Q9, to the gate terminal of transistor Q8, maintaining transistor Q8 in its normally ON condition and keeping the gate terminal of input transistor Q1 at a low logic level. Thus, transistor Q1 is maintained in its normally OFF condition.

With transistors Q1 and Q7 OFF, current source Q3 pulls node IL to a low logic level near ground. As a result, transistors Q5 and Q6 remain OFF. Current source Q2 simultaneously pulls node IH to a high logic level, turning transistor Q4 ON. In this condition, the output C is at a high logic level, approximately one diode-drop below $V_{DD}$.

Assuming now that input B is low and input A is high, the high logic input A is applied to the drain of transistor Q8 and the normally ON transistor Q9 applies the low logic input B to the gate terminal of transistor Q8. As a result, transistor Q8 turns OFF preventing the high logic input A from being applied to the gate terminal of transistor Q1. Thus, both transistors Q1 and Q7 remain OFF and the output C does not change.

When input B is high and input A is low, transistor Q7 turns ON and the high input B is applied via transistor Q9 to the gate terminal of transistor Q8 maintaining or turning it ON, depending upon its previous state. The low input A, however, applied to transistor Q1 via transistor Q8, maintains transistor Q1 in its normally OFF condition and the output C remains high. In this condition, transistor Q9 limits current flow from input B to input A through the forward-biased gate of transistor Q8. Without such current limitation, the high and low logic levels would be lowered and raised too far for reliable circuit operation. Fan-outs of four to six and higher can still be achieved, however, while improving the gate delay experienced with NAND gate 40.

Figure 12:
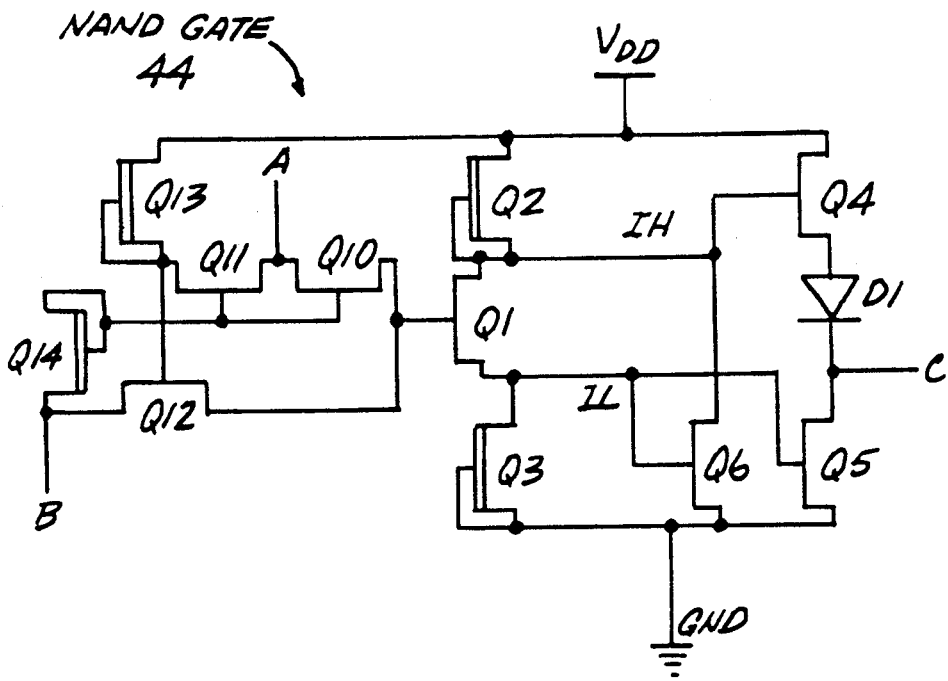
FIG. 12 schematically illustrates a second alternative embodiment of the NAND gate of FIG. 10.

Another alternative arrangement employing the FFL/QFL family to produce NAND gates is shown in FIG. 12. This arrangement modifies the basic NOR gate 26 of FIG. 7 to produce a NAND gate 44. More particularly, transistor Q7 has been deleted. In addition, three enhancement-mode transistors, Q10, Q11, and Q12, along with two depletion-mode transistors Q13 and Q14, have been added as an input section. Transistors Q10 and Q11 are connected in series, with the source terminal of transistor Q10 being connected to the gate terminal of transistor Q1, and the drain terminal of transistor Q10 being connected to the source terminal of transistor Q11. The gate terminals of transistors Q10 and Q11 are coupled to the tied gate and source terminals of transistor Q14. The drain terminal of transistor Q11 is connected to the tied gate and source terminals of transistor Q13 and the gate terminal of transistor Q12. The drain terminal of transistor Q13 is coupled to $V_{DD}$. Finally, the drain terminal of transistor Q12 is connected to the drain terminal of transistor Q14, while the source terminal of transistor Q12 is connected to the gate terminal of transistor Q1. Input A is applied at the connection of the source terminal of transistor Q11 and the drain terminal of transistor Q10 and input B is applied to the connection between the drain terminals of transistors Q12 and Q14.

Reviewing the operation of NAND gate 44, as noted previously, the output C of a NAND gate will be at a low logic level only when both inputs A and B are at high logic levels. Assuming first that both inputs A and B are at logic zero, transistors Q13 and Q14 are always ON, by virtue of their tied gate and source terminals. Because transistor Q14 is always ON, the low logic level input B applied to the gate terminals of transistors Q10 and Q11 by transistor Q14 maintains transistors Q10 and Q11 in their normally OFF conditions. Transistor Q13 pulls the gate of transistor Q12 high, allowing the low logic input B to reach the gate of transistor Q1.

In this condition, the gate terminal of input transistor Q1 is at a low logic level and transistor Q1 remains OFF. Current source Q3 then pulls node IL to a low logic level near ground, maintaining transistors Q6 and Q5 in their normally OFF state. Similarly, current source Q2 pulls node IH to a high logic level turning transistor Q4 ON. As a result, the output C is at a high logic level.

With input A at a high logic level and input B remaining low, output C does not change. More particularly, the low logic level at input B maintains transistors Q10 and Q11 in their normally OFF conditions, preventing the high logic input A from being applied to the gate terminal of transistor Q1. Thus, transistor Q1 remains OFF and output C continues to be at a high logic level.

When input B is at a high logic level and input A is low, there is no longer sufficient bias on transistor Q12 to keep it ON. Specifically, because input A is low, the gate of transistor Q12 is pulled low, turning transistor Q12 OFF. Thus, the high input B is not applied to the gate terminal of transistor Q1 via transistor Q12. The high logic input B is, however, applied through current source Q14 to the gate terminals of transistors Q10 and Q11, turning them ON. With transistor Q10 ON, the low input A is applied to the gate terminal of transistor Q1, keeping transistor Q1 OFF and the output C high.

When both inputs A and B are high, the high logic level at input A turns transistor Q12 ON. Thus, the high logic level input B is conducted by transistor Q12 to the gate terminal of transistor Q1. The high logic level input B is also applied through current source Q14 to the gate terminals of transistors Q10 and Q11, turning transistors Q10 and Q11 ON. With transistor Q10 ON, the high logic input A pulls the gate terminal of transistor Q1 to a high logic level. Thus, transistor Q1 turns ON, pulling node IL to a high logic level. This high logic level at node IL is applied to the gate terminals of transistors Q5 and Q6, turning them ON. This pulls node IH low, turning transistor Q4 OFF. With transistor Q4 OFF and transistor Q5 ON, the output C shifts to a low logic level, in accordance with standard NAND operation.

Although NAND gate 44 requires more devices than NAND gate 42 of FIG. 11, it is faster. Because there are two current paths pulling input A to a high logic level and one current path pulling input B to a low logic level when B is at a high logic level and A is low, the fan-out of gate 44 is also reduced.

Figure 13:
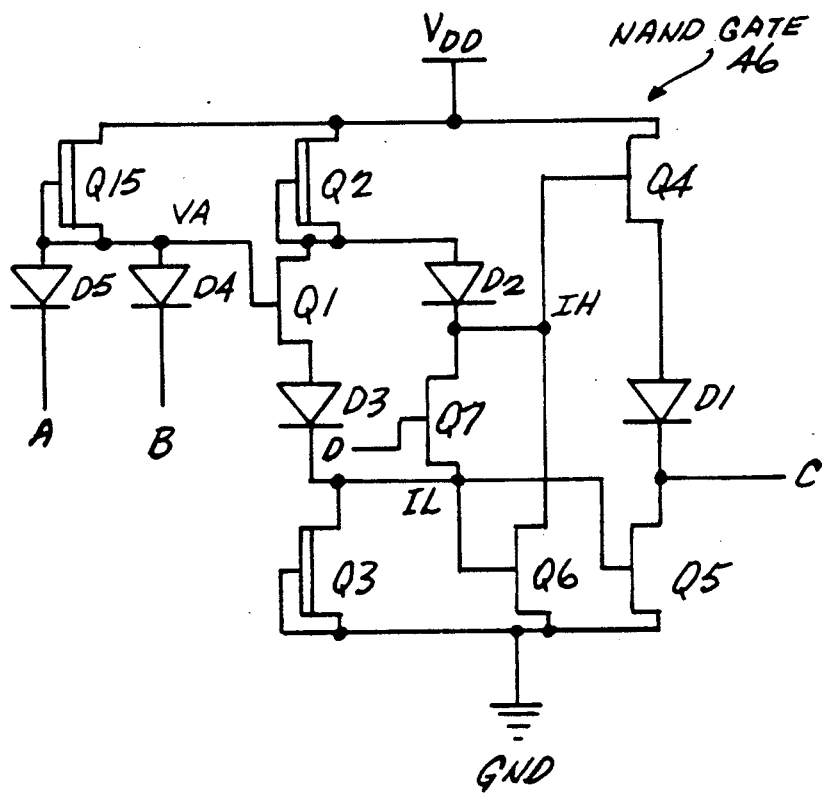
FIG. 13 schematically illustrates a third alternative embodiment of the NAND gate of FIG. 10.

FIG. 13 illustrates another alternative embodiment of an FFL/QFL NAND gate 46. Again, the basic NOR gate 26 of FIG. 7 is modified for NAND operation. As shown, another depletion-mode transistor Q15 is added, with its drain terminal connected to $V_{DD}$ and its gate and source terminals connected to the gate terminal of input transistor Q1.

A second diode D2 connects the second input transistor Q7 to current source transistor Q2, and has its positive terminal connected to the source terminal of transistor Q2 and its negative terminal connected to the drain terminals of transistors Q6 and Q7. A third diode D3, connects the current source transistor Q3 to the input transistor Q1. Specifically, the positive terminal of diode D3 is coupled to the source terminal of transistor Q1, while the negative terminal of diode D3 is connected to the drain terminal of transistor Q3 and the source terminal of transistor Q7. Finally, diodes D4 and D5 are included with their positive terminals being connected to a node that is designated VA in FIG. 13 and defined by the gate and source terminals of transistor Q15 and the gate terminal of transistor Q1.

Reviewing the operation of this circuit, the current source Q15 is always ON by virtue of the interconnection of its source and gate terminals. Thus, current source Q15 pulls node VA and, hence, the gate terminal of transistor Q1 high, as long as diodes D4 and D5 are unable to pull node VA low. Because diodes D4 and D5 will pull node VA low only if one or both of the inputs A and B is low, node VA will be at a high logic level when both inputs A and B are at a high logic level. In this condition, as noted above, current source Q15 pulls the gate terminal of transistor Q1 high, turning transistor Q1 ON. As a result, transistors Q5 and Q6 are ON; transistor Q4 turns OFF; and the output C is at a low logic level.

When one or both of the inputs A and B are at a low logic level, however, the voltage at node VA is pulled to a low level through diode D4 or D5, shutting transistor Q1 OFF. As a result, current source Q3 pulls node IL to a low logic level. With this low level applied to the gate terminals of transistors Q5 and Q6, transistors Q5 and Q6 turn OFF. At the same time, current source Q2 pulls node IH high, turning transistor Q4 ON. With transistor Q4 ON and transistor Q5 OFF, the output C is at a high logic level.

Because a low-level input must be employed to pull node VA to a low logic level, the fan-out of gate 46 is limited. NAND gate 46 also dissipates more power than certain of the preceding gates because the power supply voltage $V_{DD}$ must be one diode-drop higher than for the other topologies, if the correct operation is to be maintained.

With a third input D applied to the gate terminal of transistor Q7, gate 46 can also be used to perform a NOR operation. More particularly, as will be appreciated from the preceding discussions, the output C of gate 46 will be the logic NOR combination of input D and the NAND logic combination of A and B.

As will be appreciated, NOT gate 20 can be combined with NAND gates 40, 42, 44, or 46 to produce an AND gate. Specifically, in such an arrangement, the output C of the NAND gate is applied to input A of the NOT gate. The output C of the NOT gate will then be the logic AND combination of the NAND gate inputs A and B.

Several additional FFL/QFL gate constructions address another constraint faced by the integrated circuit designer. Specifically, it is usually desirable to provide integrated circuits that are usable with as large a range of supply voltages $V_{DD}$ as possible. For the various gates discussed above, an increase in $V_{DD}$ beyond the point at which the high logic output is limited by the input stage of subsequent gates primarily increases the power dissipated by the gates. This dissipation is the result of extra current flowing through transistor Q4 into the connected input stages and is in addition to the dissipation caused by the flow of current through transistor Q1. To reduce this extra current and, hence, allow the supply voltage to vary over a large range, several alternative configurations of FFL/QFL gates have been developed.

Figure 14:
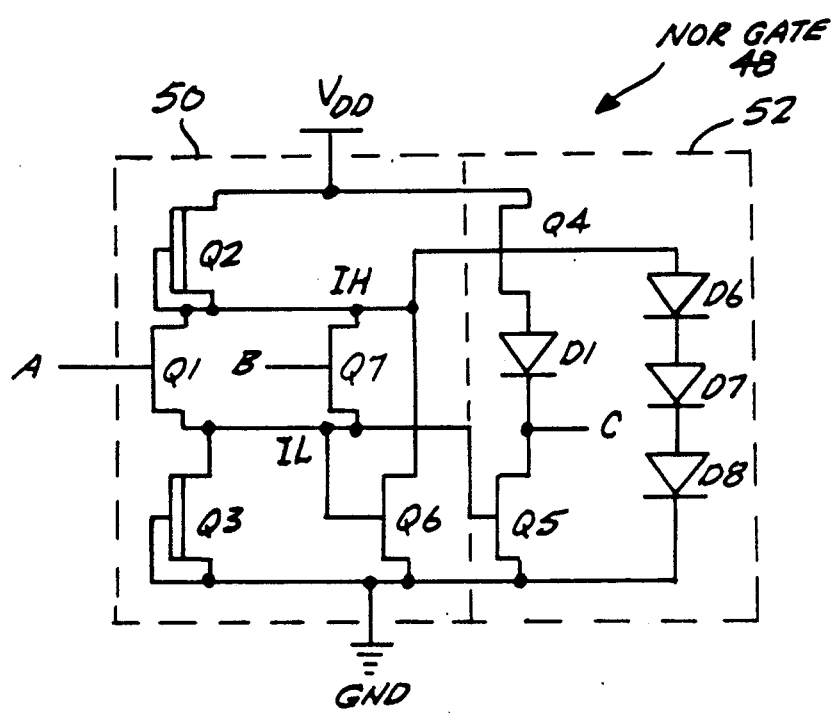
FIG. 14 schematically illustrates another alternative embodiment of the NOR gate of FIG. 7.

As shown in FIG. 14, NOR gate 48 is essentially the same as the NOR gate 26 of FIG. 7, with the addition of three diodes D6, D7, and D8. Specifically, diodes D6, D7, and D8 are connected in series, with the positive terminal of diode D6 connected to node IH; the negative terminal of diode D6 connected to the positive terminal of diode D7; the negative terminal of diode D7 connected to the positive terminal of diode D8; and the negative terminal of diode D8 connected to the source of transistor Q5.

The basic operation of NOR gate 48 is the same as NOR gate 26. The series of diodes D6, D7, and D8, however, limits the voltage at the gate terminal of transistor Q4. As a result, diodes D6, D7, and D8 prevent the high logic level at output C from becoming so high that an increase in the supply voltage $V_{DD}$ results in extra current flow through transistor Q1. At worst, with transistor Q1 always ON, the average current in the NOR gate may double. The resultant power dissipation, however, is still less than would occur without diodes D6, D7, and D8, since the output stage 52 is usually larger than the input stage 50 and can deliver more current.

Figure 15:
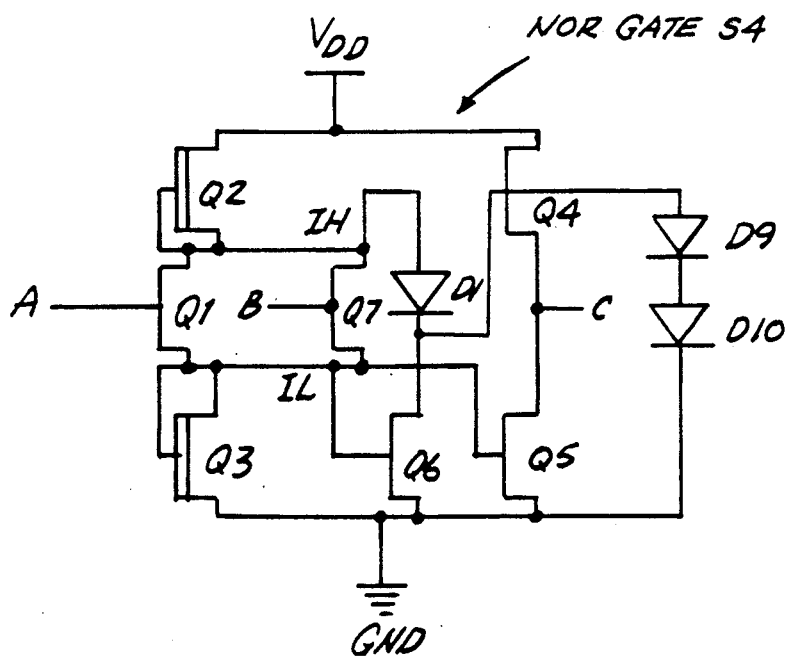
FIG. 15 schematically illustrates another alternative embodiment of the NOR gate of FIG. 7.

FIG. 15 illustrates a second alternative embodiment of a NOR gate constructed for reduced power consumption over a broad range of supply voltages $V_{DD}$. As shown, NOR gate 54 is basically the same as the NOR gate 32 shown in FIG. 8, except that diodes D9 and D10 are included. Specifically, the positive terminal of diode D9 is connected to the node IH, while the negative terminal of diode D9 is connected to the positive terminal of diode D10 and the negative terminal of diode D10 is connected to ground. Like the diodes D6, D7, and D8 of NOR gate 48, diodes D9 and D10 clamp the voltage at the gate of transistor Q4, limiting the high logic output level.

Figure 16:
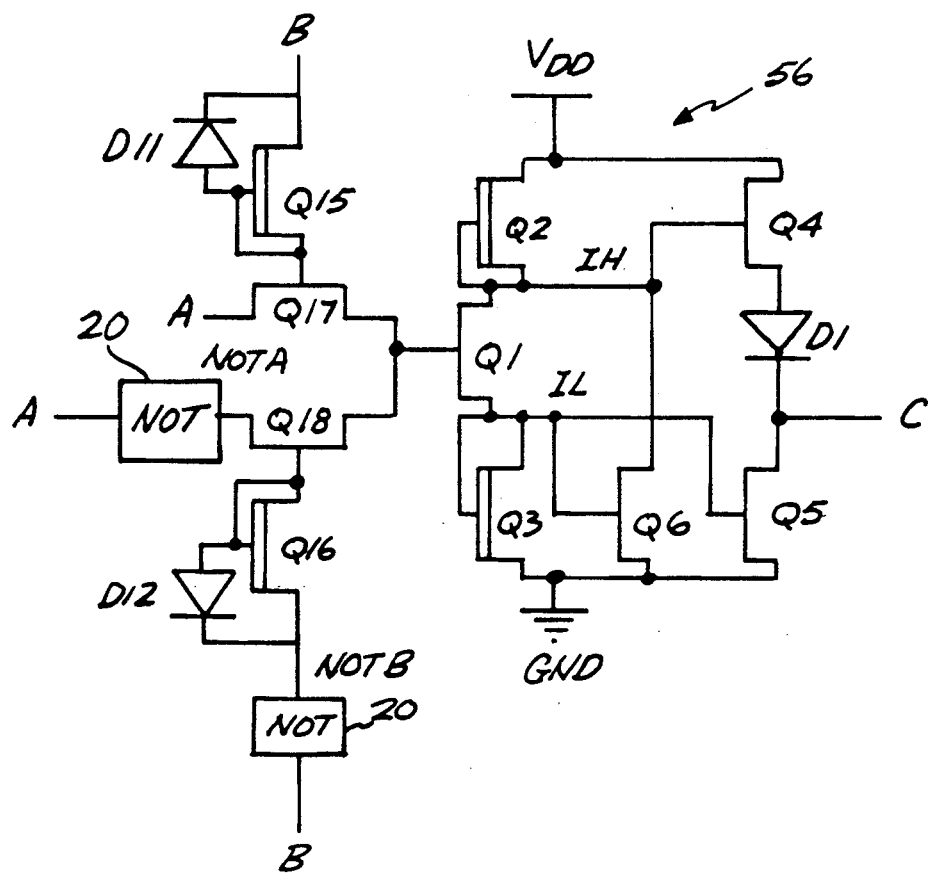
FIG. 16 schematically illustrates an exclusive-OR logic gate constructed in accordance with this invention.

The final type of gate to be addressed is the exclusive-OR gate 56 shown in FIG. 16. Basically, XOR gate 56 adds an input section including diodes D11 and D12, enhancement-mode pass transistors Q17 and Q18, and depletion-mode current limit transistors Q15 and Q16 to an FFL inverter gate to accomplish the XOR logic function. More particularly, the gate and source terminals of transistor Q15 are connected to the gate terminal of transistor Q17, while the drain and gate terminals of transistor Q15 are coupled by diode D11. Similarly, the source and gate terminals of transistor Q16 are connected to the gate terminal of transistor Q18, while the drain and gate terminals are connected by diode D12. The source terminals of transistors Q17 and Q18 are coupled to the gate terminal of input transistor Q1. Input A is applied to the drain terminal of transistor Q17 and the input B is applied to the drain terminal of transistor Q15. In addition, an input NOT A, produced by applying input A to a NOT gate 20, is applied to the drain terminal of transistor Q18. An input NOT B, produced by applying input B to a NOT gate 20, is similarly applied to the drain terminal of transistor Q16. The current limit transistors Q15 and Q16 are required to maintain reliable voltage levels. Diodes D11 and D12 are added to decrease the delay in charging the gate terminals of pass transistors Q17 and Q18. Alternatively, capacitors could be employed in place of diodes D11 and D12.

As required by the XOR logic truth table of FIG. 1F, the output C should be at a high logic level only when one input is high and one input is low. Taking the example in which input A is high and input B is low, the NOT A input will be low and the NOT B input will be high. Because transistor Q15 is always ON, the low logic input B will be applied to the gate of transistor Q17, maintaining transistor Q17 in an OFF condition. As a result, the high logic input A does not reach the gate terminal of transistor Q1. Similarly, the high logic input NOT B is applied through the ON transistor Q16 to the gate terminal of transistor Q18, turning it ON. Input NOT A is at a low logic level, however, and is insufficient to turn transistor Q1 ON. With input transistor Q1 OFF, the inverter output C is at a high logic level.

When input A is low and input B is high, transistors Q15 and Q17 mirror the previous operation of transistors Q16 and Q18, while transistors Q16 and Q18 mirror the previous operation of transistors Q15 and Q17. In other words, transistors Q15, Q16, and Q17 are ON, while transistor Q18 is OFF. Thus, the low logic input A is applied to the gate terminal of transistor Q1 by transistor Q17, while the high logic input NOT A is blocked by transistor Q18. As a result, the gate terminal of transistor Q1 remains low and the inverter output C remains high.

If both inputs A and B are either high or low, the output C of XOR gate 56 must be low. Discussing first the condition in which both inputs A and B are low, transistor Q15 is ON and applies the low logic level input B to the gate terminal of transistor Q17, maintaining it in an OFF condition. The NOT B input is at a high logic level and is applied to the gate terminal of transistor Q18 via the always ON transistor Q16. As a result, transistor Q18 turns ON, applying the high logic level input NOT A to the gate terminal of transistor Q1. The NOT operation performed by the remainder of the gate then produces a low logic level output C.

Similarly, both inputs A and B are at a high logic level; the NOT A and NOT B inputs are at a low logic level; and transistors Q15 and Q17 mirror the previous operation of transistors Q16 and Q18; while transistors Q16 and Q18 mirror the previous operation of transistors Q15 and Q17. As a result, the high logic input B is applied to the gate terminal of transistor Q17 turning it ON and allowing the high logic input A to reach the gate terminal of transistor Q1. Thus, the NOT operation performed by the remainder of the gate produces a low logic output C.

As suggested previously in connection with FIG. 5, the FFL/QFL gates described above can be combined to perform substantially any desired Boolean algebraic operation. For example, NOT and AND gates can be combined to perform the NAND operation, or NAND and NOT gates can be combined to perform the AND operation. Similarly, NOT and OR gates can be combined to perform the NOR operation, or NOR and NOT gates can be combined to perform the OR operation. In addition, buffered output sections can be included with, or deleted from, the gates as desired. In a like manner, more input transistors can be included in parallel with transistor Q1 for OR or NOR operations, or in series with transistor Q1 for AND or NAND operations.

In view of these and other observations, those skilled in the art will recognize that the embodiments of the invention disclosed herein are exemplary in nature and that various changes can be made therein without departing from the scope and the spirit of the invention. In this regard, and as was previously mentioned, the invention is readily embodied with various types of enhancement-mode and depletion-mode semiconductors. In addition, the various current sources depicted as depletion-mode transistors could be constructed as resistors. Further, as will be appreciated from FIGS. 7 and 8, the diode D1 can be included in either the input or output stage. Because of the above and numerous other variations and modifications that will occur to those skilled in the art, the following claims should not be limited to the embodiments illustrated and discussed herein.

The embodiments of the invention in which an exclusive property or privilege is claimed are defined as follows:

1. A member of a family of logic gates, each of which is for performing a logic operation upon one two-state input to produce a two-state output, said member comprising:
   a first input field-effect transistor, operable in an enhancement mode and having gate, drain, and source terminals, said gate terminal being for receiving the two-state input; and
   a control field-effect transistor, operable in an enhancement mode and having gate, drain, and source terminals, said gate terminal of said control transistor being coupled to said source terminal of said first input transistor, said drain terminal of said control transistor being coupled to said drain terminal of said first input transistor, said first input transistor and said control transistor cooperatively performing the logic operation to produce the two-state output at said drain terminal of said control transistor.

2. The member of claim 1, for use with a second two-state input and further comprising a second input field-effect transistor, operable in an enhancement mode and having gate, drain, and source terminals, said gate terminal of said second input transistor being for receiving the second two-state input, said drain terminal of said second input transistor being coupled to said drain terminal of said first input transistor, said source terminal of said second input transistor being coupled to said source terminal of said first input transistor, said first and second input transistors and said control transistor cooperatively performing the logic operation to produce the two-state output at said drain terminal of said control transistor.

3. The member of claim 1, for use with a second two-state input and further comprising a second input field-effect transistor, operable in an enhancement mode and having gate, drain, and source terminals, said gate terminal of said second input transistor being for receiving the second two-state input, said source terminal of said second input transistor being coupled to said drain terminal of said first input transistor, and said drain terminal of said second input transistor being coupled to said drain terminal of said control transistor.

4. The member of claim 1, further comprising first and second current sources coupled to said drain and source terminals of said first input transistor.

5. The member of claim 1, further comprising a buffered output section coupled to said first input transistor and said control transistor.

6. The member of claim 1, wherein the first input transistor and the control transistor are gallium arsenide semiconducting devices.

7. The member of claim 1, wherein the first input transistor and the control transistor are metal-semiconductor field-effect transistors.

8. A gate, from a family of gates, for performing a logic operation upon a two-state input to produce a two-state output, said gate comprising:
- a first input field-effect transistor, operable in an enhancement mode and having gate, drain, and source terminals, said gate terminal being for receiving said two-state input;
- a first source field-effect transistor, operable as a current source and having gate, drain, and source terminals, said source terminal of said first source transistor being coupled to said drain terminal of said first input transistor; and
- a second source field-effect transistor, operable as a current source and having gate, drain, and source terminals, said drain terminal of said second source transistor being coupled to said source terminal of said first input transistor, said first input transistor and said first and second source transistors cooperatively partially performing the logic operation upon the two-state input.

9. The gate of claim 8, further comprising a second input field-effect transistor, operable in an enhancement mode and having gate, drain, and source terminals, said drain terminal of said second input transistor being coupled to said drain terminal of said first input transistor, and said source terminal of said second input transistor being coupled to said source terminal of said first input transistor.

10. The gate of claim 8, further comprising a second input field-effect transistor, operable in an enhancement mode and having gate, drain, and source terminals, said drain terminal of said second input transistor being coupled to said source terminal of said first source transistor and said source terminal of said second input transistor being coupled to said drain terminal of said first input transistor.

11. The gate of claim 8, further comprising a control field-effect transistor, operable in an enhancement mode and having gate, drain, and source terminals, said gate terminal of said control transistor being coupled to said source terminal of said first input transistor, and said drain terminal of said control transistor being coupled to said drain terminal of said first input transistor.

12. The gate of claim 8, further comprising a buffered output section coupled to said first input transistor and said first and second source transistors.

13. The gate of claim 8, wherein said first input transistor and said first and second souce transistors are gallium arsenide semiconducting devices.

14. The gate of claim 8, wherein said first input transistor and said first and second source transistors are metal-semiconductor field-effect transistors.

15. A logic gate, for producing a digital output in response to first and second digital inputs, comprising:
- a first input field-effect transistor, operable in an enhancement mode and having gate, drain, and source terminals, said gate terminal being for receiving the first digital input;
- a second input field-effect transistor, operable in an enhancement mode and having gate, drain, and source terminals, said gate terminal being for receiving the second digital input, said drain and source terminals of said first input transistor being coupled to said drain and source terminals, respectively, of said second input transistor; and
- a control field-effect transistor, operable in an enhancement mode and having gate, drain, and source terminals, said gate terminal of said control transistor being coupled to said source terminal of said first input transistor, said drain terminals of said control transistor and said first and second input transistors being coupled together, said control transistor and said first and second input transistors cooperatively responding to the first and second digital inputs to produce the digital output.

16. The logic gate of claim 15, further comprising current means for providing a current source for said first and second input transistors, said current means being coupled to said drain and source terminals of said first and second input transistors.

17. The logic gate of claim 16, wherein said current means comprises first and second source field-effect transistors, said first source transistor operable in a depletion mode and having gate, drain, and source terminals, said gate and source terminals of said first source transistor being coupled to said drain terminals of said first and second input transistors, said second source transistor also being operable in a depletion mode and having gate, drain, and source terminals, said drain terminal of said second source transistor being coupled to said source terminals of said first and second input transistors.

18. The logic gate of claim 17, for use with a voltage supply, wherein said drain terminal of said first source transistor and said source terminal of said second source transistor are coupleable to the voltage supply.

19. The logic gate of claim 17, wherein the digital output is the NOR logical combination of the first and second digital inputs.

20. The logic gate of claim 17, further comprising an output section including first and second output field-effect transistors, said first and second output transistors each being operable in an enhancement mode and having gate, drain, and source terminals, said drain terminal of said first output transistor being coupleable to said drain terminal of said first source transistor and said source terminal of said second output transistor being coupleable to said source terminal of said second source transistor, said gate terminal of said first output transistor being coupled to said drain terminal of said control transistor, said source terminal of said first output transistor being coupled to said drain terminal of said second output transistor, and said gate terminal of said second output transistor being coupled to said gate terminal of said control transistor.

21. The logic gate of claim 20, further comprising a first diode coupled between said source terminal of said first output transistor and said drain terminal of said second output transistor and wherein said gate terminal of said second source transistor is coupled to said source terminal of said second source transistor.

22. The logic gate of claim 21, wherein the digital output is the NOR logical combination of the first and second digital inputs.

23. The logic gate of claim 21, further comprising a plurality of additional diodes connected in series between said gate terminal of said first output transistor and said source terminal of said second output transistor and wherein the digital output is the NOR logical combination of the first and second digital inputs.

24. The logic gate of claim 20, further comprising a first diode coupled between said gate terminal of said first output transistor and said drain terminals of said first and second input transistors and wherein said gate terminal of said second source transistor is coupled to said drain terminal of said second source transistor.

25. The logic gate of claim 24, wherein the digital output is the NOR logical combination of the first and second digital inputs.

26. The logic gate of claim 24, further comprising a plurality of additional diodes connected in series between said gate terminal of said first output transistor and said source terminal of said second output transistor and wherein the digital output is the NOR logical combination of the first and second digital inputs.

27. The logic gate of claim 17, further comprising:
 a first diode connected between said source of said first source transistor and said drain of said second input transistor;
 a second diode connected between said source of said first input transistor and said source of said second input transistor;
 a third source field-effect transistor, operable in a depletion mode and having gate, drain, and source terminals, said drain terminal of said third source transistor being coupled to said drain terminal of said first source transistor and said source and said gate terminals of said third source transistor being coupled to said gate terminal of said first input transistor; and
 third and fourth diodes coupled to said source terminal of said third source transistor, said third and fourth diodes being for receiving the first and second digital inputs, the digital output being the NAND logical combination of the first and second digital inputs.

28. A logic gate, for producing a digital output in response to a first digital input, comprising:
 a first input field-effect transistor, operable in an enhancement mode and having gate, drain, and source terminals; and,
 a control field-effect transistor, operable in an enhancement mode and having gate, drain, and source terminals, said gate terminal of said control transistor being coupled to said source terminal of said first input transistor, said drain terminal of said control transistor being coupled to said drain terminal of said first input transistor.

29. The gate of claim 28, further comprising:
 first and second source field-effect transistors, each being operable in a depletion mode and having gate, drain, and source terminals, said gate and source terminals of said first source transistor being coupled to said drain terminal of said first input transistor, said drain terminal of said second source transistor being coupled to said source terminal of said first input transistor;
 first and second output field-effect transistors, each being operable in an enhancement mode and having gate, drain, and source terminals, said gate terminal of said first output transistor being coupled to said source terminal of said first source transistor, said gate terminal of said second output transistor being coupled to said drain terminal of said second source transistor, said drain terminal of said first output transistor being coupled to said drain terminal of said first source transistor, said source terminal of said second output transistor being coupled to said source and gate terminals of said second source transistor; and
 a diode for coupling said source terminal of said first output transistor to said drain terminal of said second output transistor.

30. The gate of claim 28, further comprising:
 a second input field-effect transistor, operable in an enhancement mode and having gate, drain, and source terminals, said drain terminal of said second input transistor being coupled to said drain terminal of said control transistor, said source terminal of said second input transistor being coupled to said drain terminal of said first input transistor; and
 a third input field-effect transistor, operable in a depletion mode and having gate, drain, and source terminals, said source terminal of said third input transistor being coupled to said gate terminal of said first input transistor.

31. The gate of claim 30, wherein said gate is for producing a digital output in response to, and as a function of, the logical NAND of first and second digital inputs, the first digital input being applicable to said drain terminal of said third input transistor and the second digital input being applicable to said gate terminal of said second input transistor.

32. The gate of claim 30, further comprising:
 a fourth input field-effect transistor, operable in a depletion mode and having gate, drain, and source terminals, said gate and source terminals of said fourth input transistor being coupled to said gate terminal of said third input transistor and said drain terminal of said fourth input transistor being coupled to said gate terminal of said second input transistor.

33. The gate of claim 32, wherein said gate is for producing a digital output in response to, and as a function of, the logical NAND of first and second digital inputs, the first digital input being applicable to said drain terminal of said third input transistor and the second digital input being applicable to said gate terminal of said second input transistor.

34. The logic gate of claim 28, further comprising second, third, fourth, fifth, and sixth input field-effect transistors, said second and third input transistors each being operable in a depletion mode and having gate, drain, and source terminals, said fourth, fifth, and sixth input transistors each being operable in an enhancement mode and having gate, drain, and source terminals, said gate terminals of said second, fifth, and sixth input transistors being coupled together, said gate and source terminals of said third input transistor being coupled to said gate terminal of said fourth input transistor, said drain terminal of said fourth input transistor and said source of said sixth input transistor being coupled to said gate terminal of said first input transistor, said source terminal of said third input transistor being coupled to said drain terminal of said fifth input transistor, said source and gate terminals of said second input transistor being coupled together, and said drain terminal of said second input transistor being coupled to said source terminal of said fourth input transistor.

35. The logic gate of claim 28, further comprising:
second and third input field-effect transistors, each being operable in an enhancement mode and having gate, drain, and source terminals, said source terminal of said second input transistor and said source terminal of said third input transistor being coupled to said gate terminal of said first input transistor; and
fourth and fifth input field-effect transistors, each being operable in a depletion mode and having gate, drain, and source terminals, said gate and source terminals of said fourth input transistor being coupled to said gate terminal of said second input transistor and said gate and source terminals of said fifth input transistor being coupled to said gate terminal of said third input transistor.

36. The logic gate of claim 35, further comprising a first speed-up diode coupling the drain and gate terminals of said fourth input transistor and a second speed-up diode coupling the drain and gate terminals of said fifth input transistor.

37. The logic gate of claim 36, further comprising a first NOT logic gate coupled to said drain terminal of said third input transistor and a second NOT logic gate coupled to said drain terminal of said fifth input transistor.

38. The logic gate of claim 37, wherein said gate is for producing a digital output in response to, and as a function of, the logical exclusive-OR of first and second digital inputs, said first digital input being applicable to said drain terminal of said second input transistor and said first NOT logic gate, said second digital input being applicable to said drain terminal of said fourth input transistor and said second NOT logic gate.

39. A logic gate input section, having an output, comprising:
first and second input field-effect transistors, each being operable in an enhancement mode and having gate, drain, and source terminals, said source terminal of said first input transistor and said source terminal of said second input transistor being coupled to define said output; and
third and fourth input field-effect transistors, each being operable in a depletion mode and having gate, drain, and source terminals, said gate and source terminals of said third input transistor being coupled to said gate terminal of said first input transistor and said gate and source terminals of said fourth input transistor being coupled to said gate terminal of said second input transistor.

40. The logic gate input section of claim 39, further comprising a first speed-up diode coupling the drain and gate terminals of said third input transistor and a second speed-up diode coupling the drain and gate terminals of said fourth input transistor.

41. The logic gate input section of claim 40, further comprising a first NOT logic gate coupled to said drain terminal of said second input transistor and a second NOT logic gate coupled to said drain terminal of said fourth input transistor.

42. The logic gate input section of claim 39, wherein said input section is for use with a NOR gate to perform XOR logic operations.

43. A logic gate input section, having an output, comprising:
a first input field-effect transistor, operable in an enhancement mode and having gate, drain, and source terminals;
a second input field-effect transistor, operable in an enhancement mode and having gate, drain, and source terminals, said source terminal of said second input transistor being coupled to said drain terminal of said first input transistor; and
a third input field-effect transistor, operable in a depletion mode and having gate, drain, and source terminals, said source terminal of said third input transistor being coupled to said gate terminal of said first input transistor.

44. The logic gate input section of claim 43, further comprising a fourth input field-effect transistor, operable in a depletion mode and having gate, drain, and source terminals, said gate and source terminals of said fourth input transistor being coupled to said gate terminal of said third input transistor and said drain terminal of said fourth input transistor being coupled to said gate terminal of said second input transistor.

45. The logic gate input section of claim 43, wherein said input section is for use with a NOR gate to perform NAND logic operations.

46. A logic gate input section, having an output, comprising:
first, second, third, fourth, and fifth input field-effect transistors, said first and second input transistors each being operable in a depletion mode and having gate, drain, and source terminals, said third, fourth, and fifth input transistors each being operable in an enhancement mode and having gate, drain, and source terminals, said gate terminals of said first, fourth, and fifth input terminals being coupled together, said gate and source terminals of said second input transistor being coupled to said gate terminal of said third input transistor, said drain terminal of said third input transistor and said source terminal of said fifth input transistor defining said output, said source terminal of said second input transistor being coupled to said drain terminal of said fourth input transistor, said source and gate terminals of said first input transistor being coupled together, said drain terminal of said first input transistor being coupled to said source terminal of said third input transistor.

47. The logic gate input section of claim 46, wherein said input section is for use with a NOR gate to perform NAND logic operations.

* * * * *